US009699891B2

(12) United States Patent
Yamayose et al.

(10) Patent No.: US 9,699,891 B2
(45) Date of Patent: Jul. 4, 2017

(54) SUBSTRATE AND METHOD FOR MOUNTING SEMICONDUCTOR PACKAGE

(75) Inventors: Yuu Yamayose, Fuchu (JP); Kenji Hirohata, Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 978 days.

(21) Appl. No.: 13/428,375

(22) Filed: Mar. 23, 2012

(65) Prior Publication Data
US 2012/0176149 A1   Jul. 12, 2012

Related U.S. Application Data

(63) Continuation of application No. PCT/JP2009/066698, filed on Sep. 25, 2009.

(51) Int. Cl.
*G01R 31/02* (2006.01)
*H05K 1/02* (2006.01)
*H05K 3/34* (2006.01)

(52) U.S. Cl.
CPC .. *H05K 1/0268* (2013.01); *H01L 2224/32225* (2013.01); *H01L 2924/15311* (2013.01); *H05K 1/0293* (2013.01); *H05K 3/3436* (2013.01); *H05K 2201/10734* (2013.01); *H05K 2203/163* (2013.01); *H05K 2203/175* (2013.01)

(58) Field of Classification Search
CPC .. G01R 31/26; G01R 31/046; G01R 31/2853; H05K 1/0268; H05K 1/0293; H05K 3/3436; H05K 2203/175; H05K 2201/10734; H05K 2203/163; H01L 2924/15311; H01L 2224/32225; H01L 23/58

USPC .................... 324/421, 525, 691, 762.01, 508
See application file for complete search history.

(56) References Cited

U.S. PATENT DOCUMENTS 5,736,862 A * 4/1998 Hamblin ....................... 324/527
2005/0236617 A1* 10/2005 Yamada .................. H01L 23/62
257/48

FOREIGN PATENT DOCUMENTS

| JP | 2002-134853 A | 5/2002 |
| JP | 2002134853 A * | 5/2002 |
| JP | 2005-347651 A | 12/2005 |
| JP | 2007-035889 A | 2/2007 |

(Continued)

OTHER PUBLICATIONS

English Translation of IPRP dated Apr. 19, 2012 from PCT/JP2009/066698; 5 pages.

(Continued)

*Primary Examiner* — Son Le
(74) *Attorney, Agent, or Firm* — Ohlandt, Greeley, Ruggiero & Perle, L.L.P.

(57) ABSTRACT

A substrate includes a join-structure including a semiconductor package, first electrode pad, bump, second electrode pad, and circuit substrate joined in the order named. The substrate also includes a first wire and a second wire formed in a region below a corner of the semiconductor package. The first and second wires are configured to detect a change in electrical resistance value when the first wire or the second wire is disconnected. One of the first and second wires is connected to the first electrode pad or the second electrode pad. A break strength of each of the first wire and the second wire is lower than a break strength of the join-structure.

7 Claims, 10 Drawing Sheets

(56) References Cited

FOREIGN PATENT DOCUMENTS

WO    2008149445  A1    12/2008

OTHER PUBLICATIONS

International Search Report dated Oct. 27, 2009 from PCT/JP2009/066698.

* cited by examiner

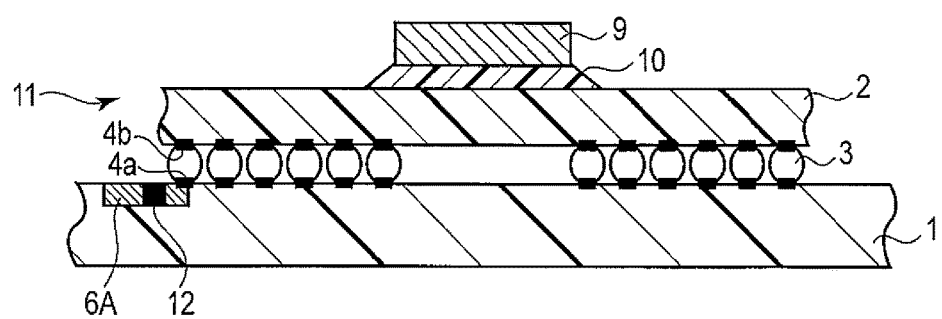
F I G. 2

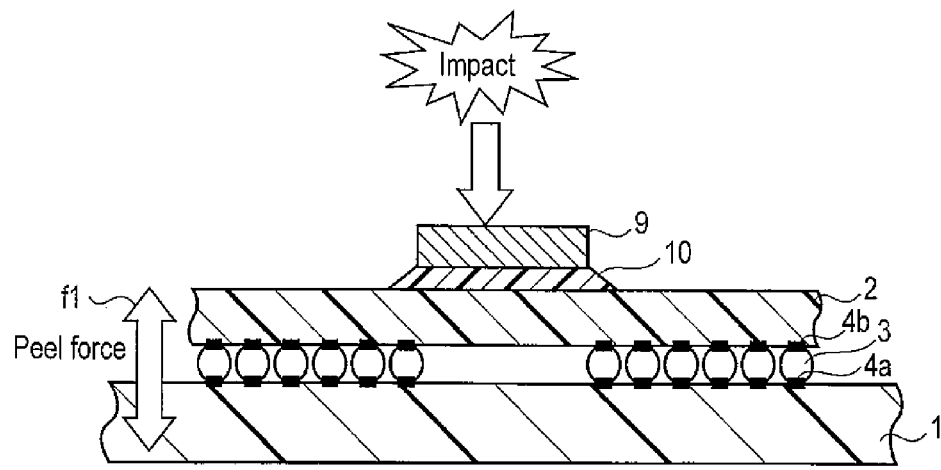
F I G. 4
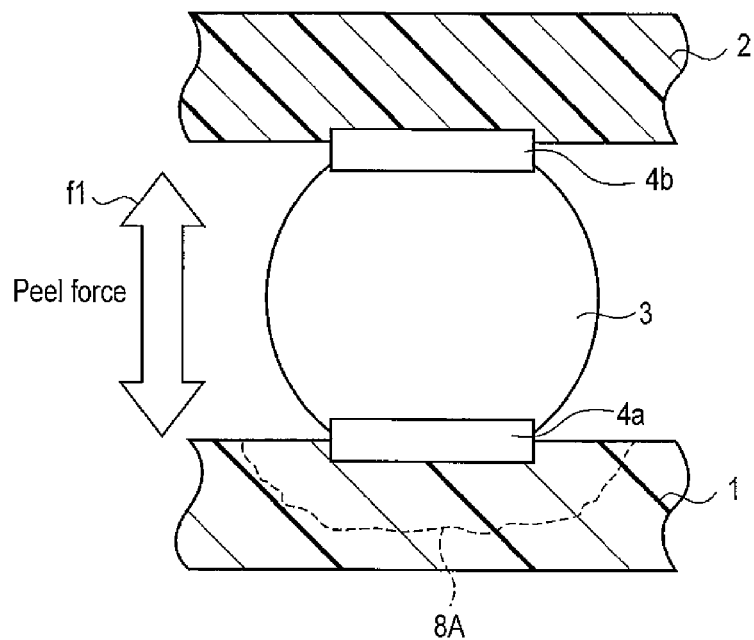
F I G. 5

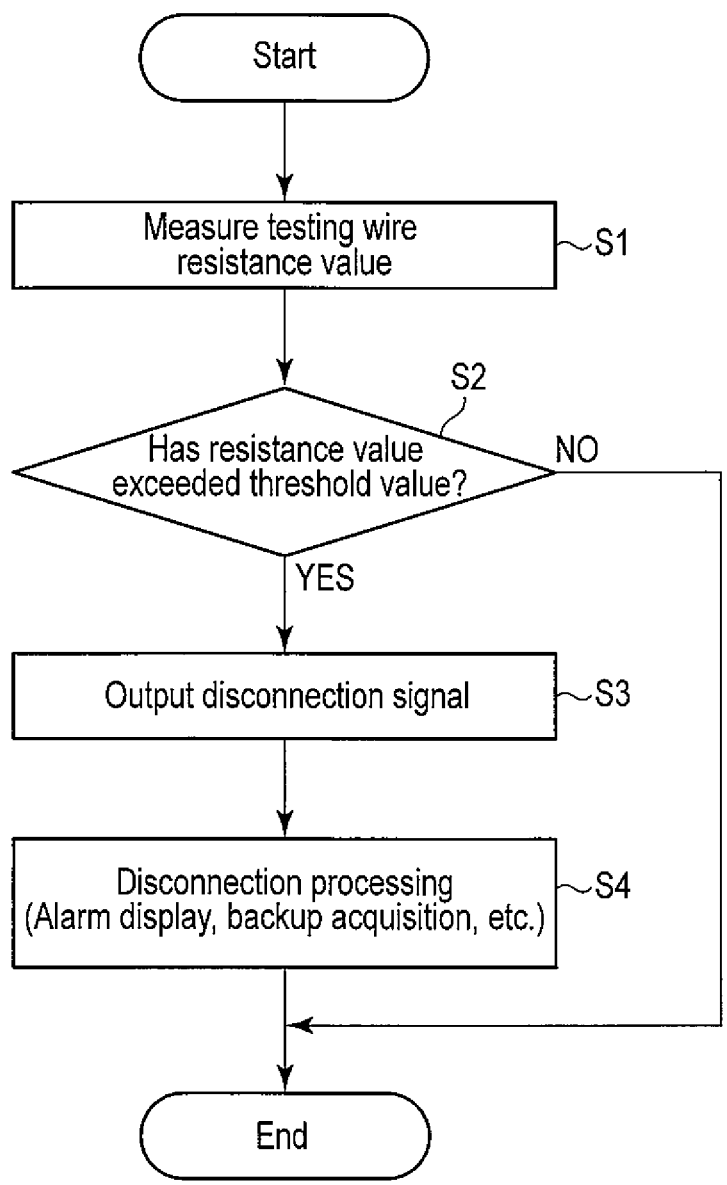
F I G. 13

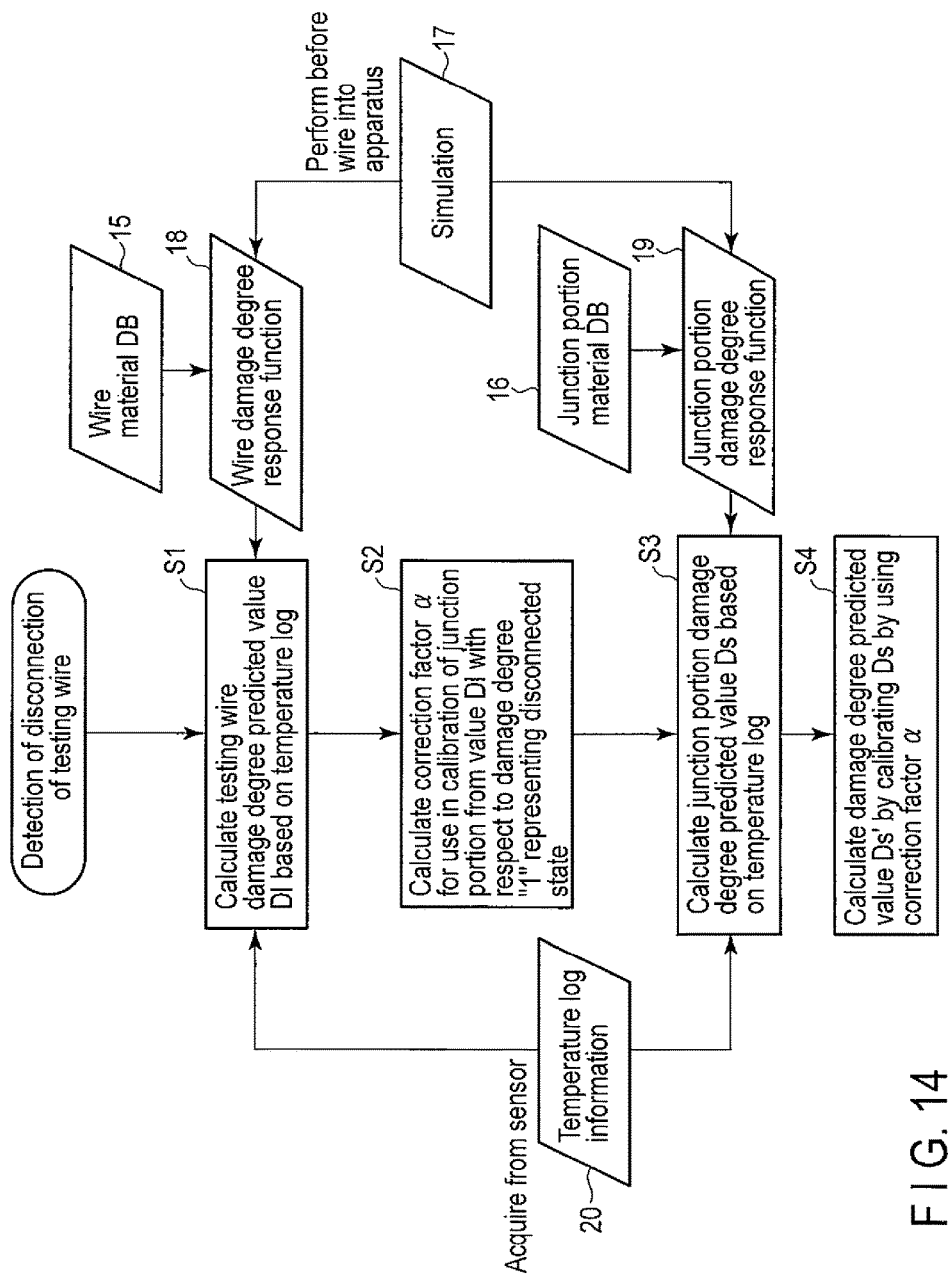
F I G. 14

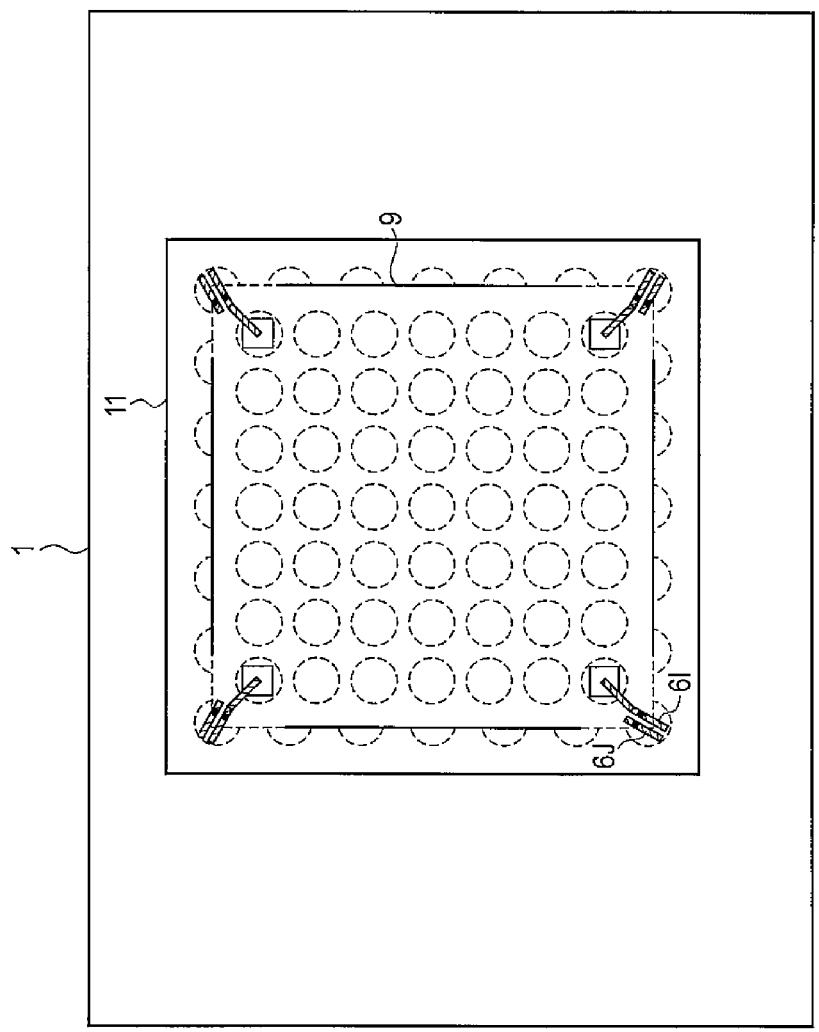
F I G. 16

SUBSTRATE AND METHOD FOR MOUNTING SEMICONDUCTOR PACKAGE

CROSS-REFERENCE TO RELATED APPLICATIONS

This application is a Continuation Application of PCT Application No. PCT/JP2009/066698, filed Sep. 25, 2009, the entire contents of which are incorporated herein by reference.

FIELD

Embodiments described herein relate generally to a substrate to which a semiconductor package is joined.

BACKGROUND

Recently, the development of downsized high-performance electronic apparatuses is advancing, and the number of input/output signal pins of semiconductor devices is more and more increasing. On the other hand, a demand has arisen for downsizing semiconductor devices. To achieve high-density mounting meeting this demand, the currently prevalent semiconductor package mounting method has changed from a mounting method such as QFP (Quad Flat Package) using conventional leads to a surface mounting method such as BGA (Ball Grid Array) capable of mounting a large number of signal pins at a high density.

The problem of high-density mounting using BGA is to ensure the reliability of a junction portion between a semiconductor package and substrate. More specifically, bumps of individual junction portions are downsized for high-density mounting, and this decreases the junction area and the height of each bump. Since this decreases a margin for absorbing and reducing loads applied to the junction portion, the reliability of the junction portion decreases.

From the viewpoint of loads, junction portions of electronic apparatuses such as a notebook PC and cell phone are damaged little by little by the application of external loads such as impact, vibration, and pressure. If this damage builds up, the junction portions completely break and cause electrical connection defects. Loads are not limited to these external loads. Junction portions are damaged by the application of loads resulting from heat generation and temperature fluctuations when an electronic device is driven in a semiconductor package mounted on a substrate. This is so because there is a difference between the thermal expansion coefficients of the mounted semiconductor package and substrate, so the deformation amounts of the semiconductor package and substrate are different when the temperature fluctuates, and the junction portions absorb this difference between the deformation amounts.

Even when no defect occurs due to one load, a defect occurs due to a repetitive load in many cases. Against this repetitive load, detecting the sign of the occurrence of a defect before damage builds up to cause the defect can be an effective failure prediction method. If the sign of the occurrence of a defect can be detected before the defect occurs, it is possible to take measures, e.g., acquire a data backup and perform maintenance in advance.

BRIEF DESCRIPTION OF THE DRAWINGS

FIG. 2 is a sectional view of the substrate according to the first embodiment;

FIG. 4 is a view for explaining an impact load;

FIG. 5 is a view for explaining a break mode of a junction portion caused by the impact load;

FIG. 13 is a flowchart showing the operation procedure of a disconnection determination process;

FIG. 14 is a flowchart showing the procedure of an operation of increasing the accuracy of failure prediction;

FIG. 16 is a plan view of a substrate according to the third embodiment.

DETAILED DESCRIPTION

In general, according to one embodiment, a substrate includes a join-structure including a semiconductor package, first electrode pad, bump, second electrode pad, and circuit substrate joined in the order named. The substrate also includes a first wire and a second wire formed in a region below a corner of the semiconductor package. The first and second wires are configured to detect a change in electrical resistance value when the first wire or the second wire is disconnected. One of the first and second wires is connected to the first electrode pad or the second electrode pad. A break strength of each of the first wire and the second wire is lower than a break strength of the join-structure.

(First Embodiment)

Figure 1:
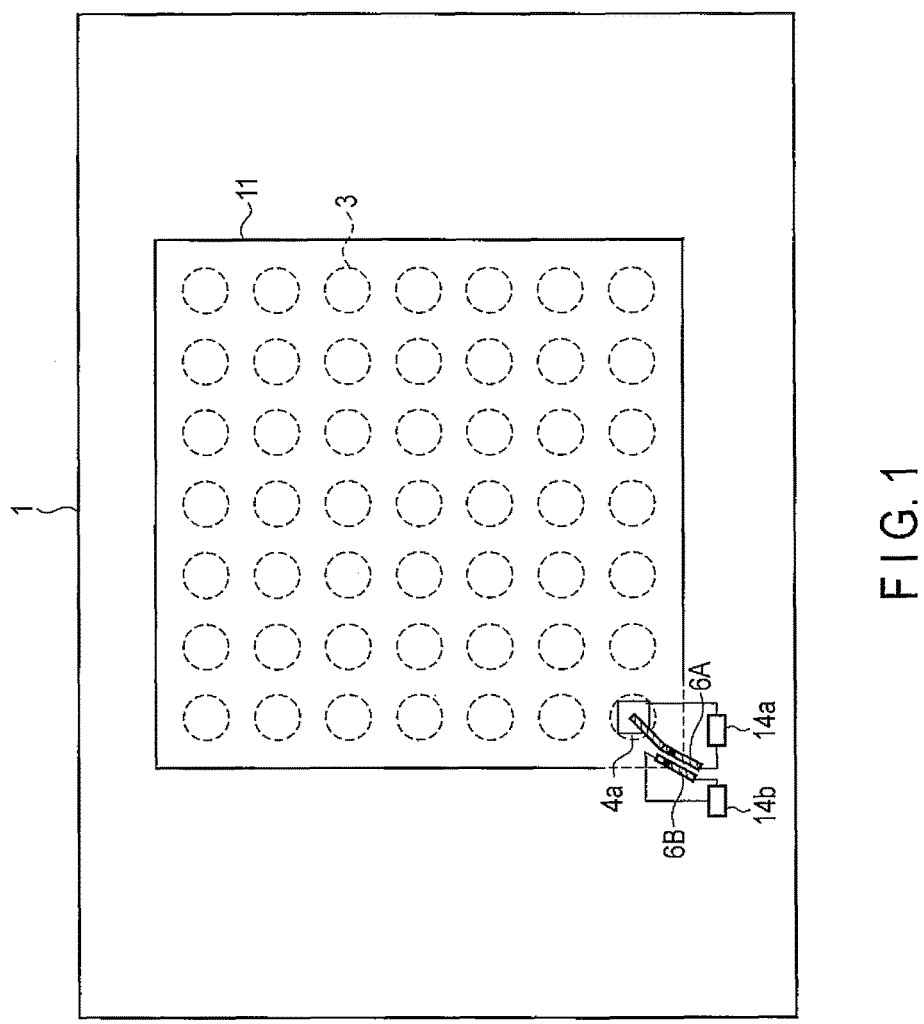
FIG. 1 is a plan view of a substrate according to the first embodiment.

FIGS. 1 and 2 are views for explaining a substrate according to the first embodiment. FIG. 1 is a plan view of the substrate viewed from above. FIG. 2 is a sectional view of the substrate.

A substrate 1 is a substrate for mounting a semiconductor package 11 by BGA (Ball Grid Array), and used in various electronic apparatuses. As shown in FIG. 1, the semiconductor package 11 is joined on the upper surface of the substrate 1 via a plurality of BGA bumps 3. Also, two testing wires, i.e., first and second wires 6A and 6B for use in failure prediction are formed on the substrate 1. The first and second wires 6A and 6B are wires for detecting the change in electrical resistance value when they are disconnected, and have a low-strength structure. (called "a canary wire structure") to be explained in detail later. On the substrate 1, the first and second wires 6A and 6B are formed in a position below the corner of the semiconductor package 11. The first wire 6A is connected to a first measurement circuit 14*a*, and the second wire 6B is connected to a second measurement circuit 14*b*. Also, the first and second wires 6A and 6B are conductive electric wires. Note that the following drawings do not show wires irrelevant to failure prediction, i.e., original wires of the semiconductor package 11 and substrate 1.

As shown in FIG. 2, the semiconductor package 11 is joined on the upper surface of the substrate 1 via the plurality of BGA bumps 3. More specifically, electrode pads 4a are formed on the substrate 1, and electrode pads 4b are formed on the reverse surface of the semiconductor package 11. The substrate 1 and semiconductor package 11 are joined via the electrode pads 4a, BGA bumps 3, and electrode pads 4b.

The semiconductor package 11 includes one or a plurality of semiconductor chips 9, and a package substrate 2 on which the semiconductor chips 9 are joined. The semiconductor chip 9 is obtained by forming elements such as logic circuits and memories on, e.g., a silicon (Si) wafer by the semiconductor fabrication process. As the package substrate 2, a silicon substrate, a ceramic substrate, a glass epoxy substrate, or a buildup multilayered substrate including a core layer and buildup layer is used. An underfill resin 10 is filled in a junction portion between the semiconductor chip 9 and package substrate 2 in order to improve the reliability. After the semiconductor chip 9 and package substrate 2 are joined, the semiconductor chip 9 is encapsulated in the semiconductor package 11 by a molding resin.

Figure 3:
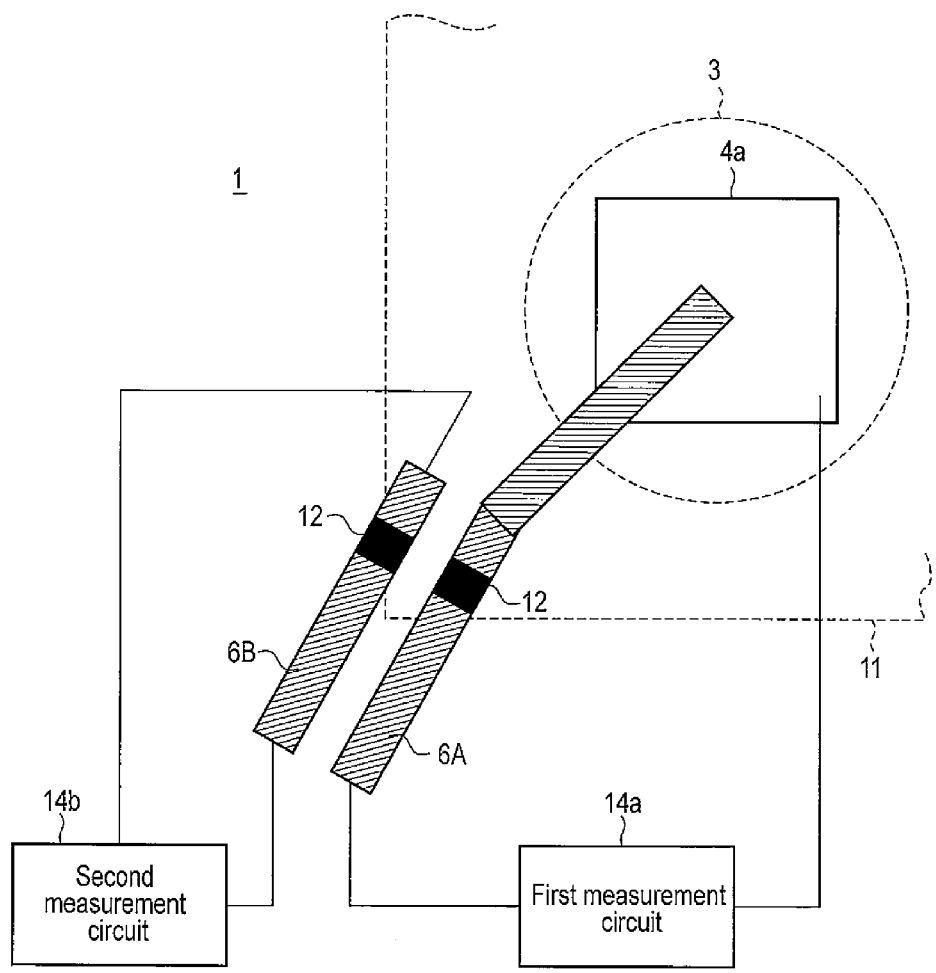
FIG. 3 is a view showing details of testing wires according to the first embodiment.

FIG. 3 is a view showing the testing wires in an enlarged scale. As described above, the first and second wires 6A and 6B are formed on the substrate 1, and used in failure prediction. The first wire 6A has one end connected to the electrode pad 4a, and the other end connected to the first measurement circuit 14a. The electrode pad 4a and first measurement circuit 14a are electrically connected. This forms an electric circuit including the first wire 6A and first measurement circuit 14a. The second wire 6B is not connected to any electrode pad 4a, and the two ends of the second wire 6B are connected to the second measurement circuit 14b. This forms another electric circuit including the second wire 6B and second measurement circuit 14b. Note that the first and second measurement circuits 14a and 14b are different circuits in this explanation, but they can also be integrated into a single measurement circuit. The first and second measurement circuits 14a and 14b each measure the electrical resistance value in the circuit. Failure prediction based on the measurement of the electrical resistance value will be described later.

As described above, the semiconductor package 11 is mounted on the substrate 1 according to the first embodiment by the ball grid array (BGA) via the BGA bumps 3. The first and second wires 6A and 6B are formed in the region of the substrate 11 below the corner of the semiconductor package 11 to be joined. The first and second wires 6A and 6B are used to measure the change in electrical resistance value when they are disconnected, and are made of a conductive metal. The substrate 1 includes the electrode pads 4a on which the BGA bumps 3 are formed, and one end of the first wire 6A is connected to the electrode pad 4a. One end of the first wire 6A is connected below the junction portion of the BGA bump 3 as in this embodiment in order to predict a failure caused by an impact load. Also, each of the first and second wires 6A and 6B has a low-strength structure in the region below the corner of the semiconductor package 11. In other words, the first and second wires 6A and 6B are formed on the substrate 1 such that the low-strength structure of each of the first and second wires 6A and 6B is positioned in the region below the corner of the semiconductor package 11. The low-strength structure is a structure having a break strength lower than that of the junction between the substrate 1 and semiconductor package 11. When the same load is applied, the low-strength structure must break before the junction between the substrate 1 and semiconductor package 11 breaks.

Note that the strength of the low-strength structure of the first wire 6A is preferably the same as that of the low-strength structure of the second wire 6B. The low-strength structure of each of the first and second wires 6A and 6B is formed in the region below the corner of the semiconductor package 11 as in this embodiment, in order to predict a failure caused by a thermal load.

The substrate 1 includes the first measurement circuit 14a for measuring a first electrical resistance value, and the second measurement circuit 14b for measuring a second electrical resistance value. The first wire 6A has one end connected to the first measurement circuit 14a, and the other end connected to the electrode pad 4a. The two ends of the second wire 6B are connected to the second measurement circuit 14b.

The first measurement circuit 14a detects disconnection of the first wire 6A based on the first electrical resistance value, and outputs a first disconnection signal. The second measurement circuit 14b detects disconnection of the second wire 6B based on the second electrical resistance value, and outputs a second disconnection signal. The first and second disconnection signals are used to predict a failure of the junction portion between the substrate 1 and semiconductor package 11.

When using the first and second disconnection signals, it is possible to separately detect damage caused by an impact load and damage caused by a thermal load, to the junction portion between the substrate 1 and semiconductor package 11. The principle of the ability to separate damage to the junction portion based on the first and second disconnection signals as described above will be explained below.

First, damage inflicted to the junction portion between the substrate 1 and semiconductor package 11 by an impact and heat (temperature fluctuation) will be explained.

When the electronic apparatus suffers an impact by falling or the like, a force f1 that peels the substrate 1 and semiconductor package 11 inside the electronic apparatus from each other acts on them, as shown in FIG. 4. One dominant break mode of the junction portion caused by the peel force f1 is a break 8A between the substrate 1 and a portion including the electrode pad 4a below the BGA bump 3 as shown in FIG. 5.

Figure 6:
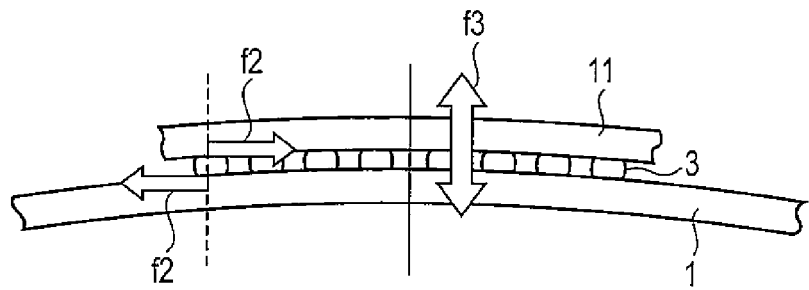
FIG. 6 is a view for explaining a thermal load.
Figure 7:
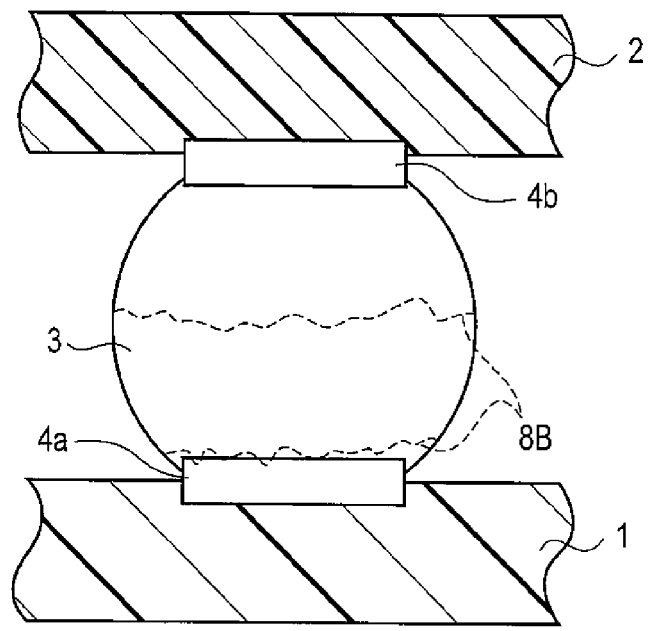
FIG. 7 is a view for explaining a break mode of the junction portion caused by the thermal load.

On the other hand, when the temperature fluctuates due to, e.g., heat generated by an element, the semiconductor package 11 and substrate 1 deform as shown in FIG. 6 because the thermal expansion coefficient of the semiconductor package 11 is generally smaller than that of the substrate 1. That is, the junction portion between the substrate 1 and semiconductor package 11 suffers a shear force f2 and tensile compressive force f3. Consequently, both the substrate 1 and semiconductor package 11 warp. If the temperature fluctuation repetitively occurs, the junction portion suffers the repetitive load of the shear force f2 and tensile compressive force f3. Finally, as shown in FIG. 7, a crack 8B reaches the interior of the BGA bump 3 or the junction portion between the bump 3 and electrode pad 4a, and a thermal fatigue break occurs. This is a break mode different from that described above.

For the two break modes caused by an impact load or thermal (repetitive) load as described above, failure prediction can be performed as follows by using the first and second wires 6A and 6B.

First, the impact load will be explained. Since the first wire 6A is connected to the electrode pad 4*a* below the BGA bump 3, the peel force f1 caused by the impact shown in FIG. 5 acts on the first wire 6A as well. In this case, the first wire 6A breaks before the junction portion between the electrode pad 4*a* and substrate 1 is disconnected, because the first wire 6A has the low-strength structure (canary wire structure) to be described later. This is the sign of a break between the electrode pad 4*a* and substrate 1. Thus, the sign of the occurrence of a defect caused by the impact load can be detected.

The thermal load will now be explained. A warpage caused by a temperature fluctuation applies a load to the wires on the surface of the substrate 1. A portion where this warpage is locally particularly large is a region below the corner of the semiconductor package 11. On the substrate 1, the low-strength structures of the first and second wires 6A and 6B are formed in the region below the corner of the semiconductor package 11. Accordingly, the first and second wires 6A and 6B break before the junction portion between the substrate 1 and semiconductor package 11 breaks by thermal fatigue. This is the sign of the occurrence of a defect caused by the thermal load (repetitive temperature fluctuation) between the substrate 1 and semiconductor package 11. Thus, the sign of the occurrence of a defect caused by the thermal load can be detected.

Note that the thermal load is almost evenly applied to the first and second wires 6A and 6B, so the first wire 6A connected to the electrode pad 4*a* is disconnected before the second wire 6B because the impact load is applied to the first wire 6A. Based on the time from the disconnection of the first wire 6A connected to the electrode pad 4*a* to that of the second wire 6B (that is not connected to any electrode pad 4*a* and forms a closed circuit on the substrate 1), it is possible to know the ratio of the damage by the impact load to that by the thermal load of the overall damage to the junction portion between the substrate 1 and semiconductor package 11.

To perform failure prediction by using the two testing wires (first and second wires 6A and 6B) as in this embodiment, the disconnection of the testing wires must occur before the break of the junction portion between the substrate 1 and semiconductor package 11, which is a target of the failure prediction. No prediction is possible if the break of the junction portion between the substrate 1 and semiconductor package 11 and the disconnection of the testing wires simultaneously occur. Therefore, each testing wire has the low-strength structure in the region below the corner of the semiconductor package 11 to which particularly high loads concentrate.

The low-strength structures of the two testing wires are desirably formed as close as possible. When the two testing wires evenly receive the load caused by the warpage of the substrate 1, it is possible to accurately separate damage caused by an impact from that caused by a thermal load. For the same reason, the low-strength structures of the two testing wires are desirably formed in positions symmetrical with respect to the diagonal line of the rectangular semiconductor package 11.

A practical shape and practical structure of the low-strength structure (canary wire structure) of the testing wire will be explained below.

Figure 8:
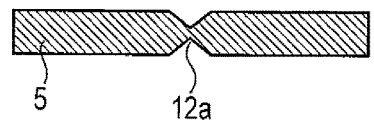
FIG. 8 is a view showing a first example of a low-strength structure.

FIG. 8 is a view showing a first example of the low-strength structure. Notches are formed in a portion of an wire 5 from its side surfaces. Since a notch end portion 12*a* functions as a strain concentration portion and receives a high load, a low-strength structure is obtained. The shape of the notch for giving a low-strength structure may have the sharp notch end portion 12*a* as shown in FIG. 8, or another shape such as an arc.

Figure 9:
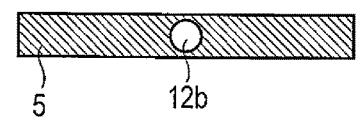
FIG. 9 is a view showing a second example of the low-strength structure.

FIG. 9 is a view showing a second example of the low-strength structure of the testing wire. A hole 12*b* is formed in a portion of an wire 5. This can implement a low-strength structure, like the notches shown in FIG. 8. Although FIG. 9 shows the circular hole 12*b*, the shape of the hole is not limited to a circle. That is, the same effect can be obtained by another shape as long as the shape causes strain concentration when formed.

Figure 10:
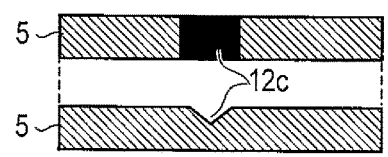
FIG. 10 is a view showing a third example of the low-strength structure.

FIG. 10 is a view showing a third example of the low-strength structure of the testing wire. A notch 12*c* is formed in a portion of an wire 5 from its upper surface. This can implement a low-strength structure as in the first and second examples.

Figure 11:
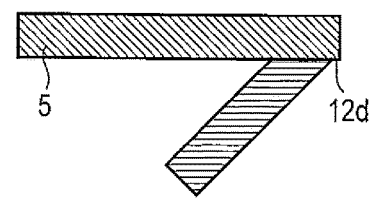
FIG. 11 is a view showing a fourth example of the low-strength structure.

FIG. 11 is a view showing a fourth example of the low-strength structure of the testing wire. A sharp bent portion 12*d* is formed in an wire 5. A low-strength structure can be implemented by thus concentrating loads to the bent portion 12*d*.

Figure 12:
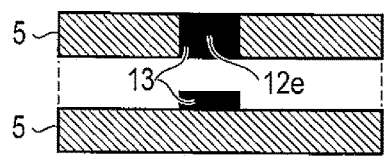
FIG. 12 is a view showing a fifth example of the low-strength structure.

FIG. 12 is a view showing a fifth example of the low-strength structure of the testing wire. A member 13 different from an wire 5 is adhered on a portion of the wire 5. This produces a thermal expansion coefficient mismatch caused by a temperature fluctuation between the portion where the member 13 is adhered and the rest of the wire 5. A low-strength structure can be implemented by thus concentrating loads to the portion where the member 13 is adhered.

The practical examples of the low-strength structure of the testing wire have been described above. The purpose of any of these structures is to accelerate the damage to the testing wire and disconnect it before the junction portion as a target of failure prediction breaks, so the structure is not limited to those enumerated above. It is possible to combine these structures, or use another structure. Also, the effect of accelerating damage caused by an impact load and thermal load changes from one structure to another. For example, the example of the low-strength structure shown in FIG. 12 accelerates damage caused by a thermal load, but has no effect on an impact load. It is favorable to form, for each product, a low-strength structure so that the testing wire is disconnected before the junction portion, by taking the above-mentioned points into account.

FIG. 13 is a flowchart showing the operation procedure of a disconnection determination process. As shown in FIG. 1, the first and second wires 6A and 6B as testing wires are respectively connected to the measurement circuits 14*a* and 14*b* for measuring the electrical resistance value. The measurement circuits 14*a* and 14*b* periodically or non-periodically measure the electrical resistance value (step S1).

If the electrical resistance value exceeds a predetermined threshold value, it is determined that disconnection has occurred (step S2), and a disconnection signal is output (step S3).

The timing at which the electrical resistance value is measured (monitored) is, e.g., the timing at which the power supply is turned on and the temperature fluctuation is large. If the power ON state continues, monitoring may be performed at a predetermined time interval. If the disconnection signal output when disconnection is found based on the change in electrical resistance value is displayed as an alarm on a display device or the like, the user can know that the damage value of the junction portion is high and break is near. It is also favorable to install a means for acquiring a data backup at the same time the disconnection signal is output. In this case, it is possible to avoid the risk that data is lost by the occurrence of a failure (step S4).

In step S4, the disconnection signals of the two testing wires are recorded together with the generation times of the signals. This makes it possible to know the degree of contribution of damage caused by an impact load and the degree of contribution of damage caused by a thermal load, of the damage inflicted to the junction portion between the substrate 1 and semiconductor package 11 when the product is in use. This knowledge can be used in maintenance and in investigation of the cause of a failure. More specifically, if a time interval from the disconnection of the first wire 6A that suffers both damage caused by an impact load and thermal load to the disconnection of the second wire 6B that suffers only damage caused by a thermal load is long, it is determined that the contribution of damage caused by the impact load is large. By contrast, if the time interval between the disconnection occurrence timings of the two testing wires (first and second wires 6A and 6B) is short, it is determined that the contribution of damage caused by the thermal load is large.

When a temperature sensor is installed in an electronic apparatus in which the substrate 1 according to this embodiment is incorporated and junction portion failure prediction is performed based on temperature log information, the accuracy of failure prediction can be increased by using the canary wire structure according to this embodiment. Failure prediction based on the temperature information and increasing the accuracy of failure prediction by using the canary wire structure will be explained with reference to FIG. 14. The detection of disconnection of the testing wire having the canary wire structure is used in calibration of the damage prediction value of the junction portion.

First, a temperature cycle test and the like are performed beforehand, thereby constructing material databases 15 and 16 concerning the thermal fatigue life and the like of materials used as the wires and junction portions. In addition, thermal stress simulation 17 is performed on a target structure, and the result is compared with the material database 15, thereby forming an wire damage degree response function 18 indicating how much damage builds up with respect to a temperature change. Furthermore, the thermal stress simulation 17 is performed on a target structure, and the result is compared with the material database 16, thereby forming a junction portion damage degree response function 19 indicating how much damage builds up with respect to a temperature change.

If disconnection of the testing wire is detected, a damage degree predicted value DI of the testing wire is calculated based on the temperature log information 20 acquired by the temperature sensor and the wire damage degree response function 18 (step S1). Then, a value representing the degree of deviation of the testing wire damage degree predicted value DI calculated in step S1 from damage degree "1" representing a disconnected state, i.e., a correction factor α for use in calibration is calculated (step S2). Subsequently, a junction portion damage degree predicted value Ds is calculated based on the temperature log information 20 acquired by the temperature sensor and the junction portion damage degree response function 19 (step S3). After that, a damage degree predicted value Ds' is calculated by calibrating the junction portion damage degree predicted value Ds by using the correction factor α calculated in step S2 (step S4).

Failure prediction based on the temperature information can be performed by calculating the damage degree predicted value Ds based on the junction portion damage degree response function 19, and detecting, before a defect actually occurs in the junction portion, that the junction portion damage degree predicted value Ds comes close to "1" indicating the occurrence of a defect. In practice, however, many errors and variation factors often cause the junction portion damage degree predicted value Ds to largely deviate from the true damage value.

The operation procedure shown in FIG. 14 can correct this deviation by calibration using the canary wire structure. That is, when the testing wire is disconnected, the true damage value of the testing wire is value "1" indicating the occurrence of a defect. The deviation of the testing wire damage predicted value DI from 1 in this state is presumably caused by an error or variation, and a similar error or variation is probably added to the junction portion damage predicted value Ds. Therefore, the junction portion damage predicted value Ds is calibrated based on the deviation of the testing wire damage predicted value DI from 1.

Calibration like this can increase the accuracy of junction portion failure prediction. Note that it is assumed that there is only one testing wire in FIG. 14. However, when performing similar calibration by using the two testing wires according to this embodiment, the failure prediction accuracy can further be increased by carrying out calibration for only a thermal load by using the second wire 6B, and calibration including the influence of an impact load by using the first wire 6.

The first embodiment explained above can provide a substrate that has an inexpensive failure prediction structure having a high degree of freedom of design, and makes it possible to separately acquire information of a load factor in order to predict a failure.

(Second Embodiment)

Figure 15:
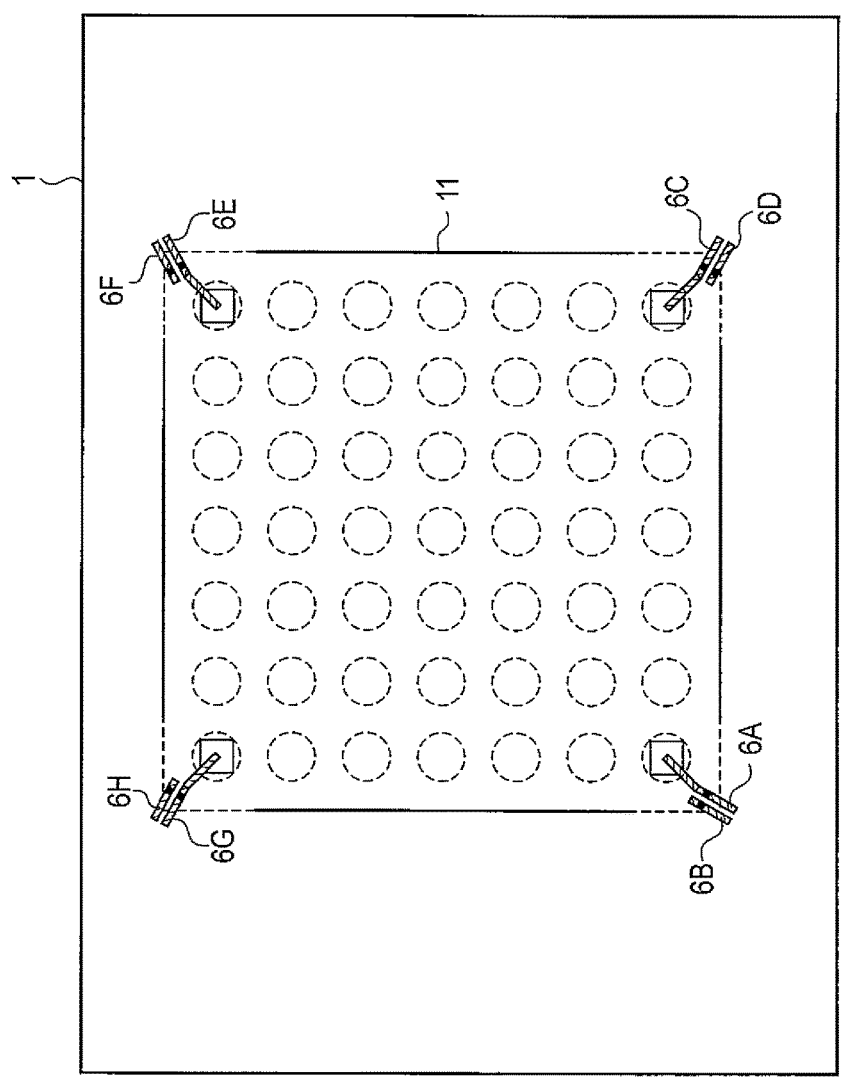
FIG. 15 is a plan view of a substrate according to the second embodiment.

FIG. 15 is a view for explaining the second embodiment. In the first embodiment, the two testing wires, i.e., the first and second wires 6A and 6B are formed below one corner of the semiconductor package 11. In the second embodiment, testing wires (6A and 6B), (6C and 6D), (6E and 6F), and (6G and 6H) are formed at all of the four corners. Although FIG. 15 does not show any resistance value measurement circuits to which the testing wires are connected, all the testing wires are connected to resistance value measurement circuits on the substrate as in the first embodiment. In the second embodiment in which the testing wires are formed in a plurality of portions, it is possible to reduce the influence of variations in disconnection information of the individual testing wires, and perform failure prediction with higher accuracy.

(Third Embodiment)

In the third embodiment, two testing wires are formed in a position on a substrate, which is different from the position of the first embodiment. More specifically, the two testing wires 6A and 6B are formed below the corner of the semiconductor package 11 in the first embodiment. In the third embodiment, two testing wires 6I and 6J are formed in that position on a substrate 1, which corresponds to a portion below the corner of a mounting region of a semiconductor chip 9 mounted on a semiconductor package 11. Note that as in the second embodiment, it is also possible to form testing wires in all positions corresponding to the four corners of the semiconductor chip 9.

A silicon wafer mainly used as the semiconductor chip 9 has a higher rigidity than those of a package substrate and substrate. For example, while the substrate rigidity is generally about 10 to 20 GPa, the rigidity of the semiconductor chip 9 is 100 GPa or more. Also, the thermal expansion coefficient of the substrate is amount 10 to 20 ppm/° C., whereas that of the semiconductor chip is about 3 ppm/° C.

A large mismatch between the materials as described above applies a high load on junction portions below the mounting region of the semiconductor chip 9, particularly, junction portions immediately below the chip corners. If the reliability of these junction portions immediately below the chip corners is a problem, it is effective to perform failure prediction on the junction portions by using the two testing wires 6I and 6J. A practical failure prediction method is the same as that of the first embodiment. Although not shown in FIG. 16, the testing wires 6I and 6J are connected to resistance value measurement circuits (not shown) on the substrate 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate comprising:
a join-structure including a semiconductor package, first electrode pad, bump, second electrode pad, and circuit substrate joined in the order named; and
a first wire and a second wire formed in a region below a corner of the semiconductor package, each of the first wire and the second wire having a low-strength structure,
wherein:
one of the first wire and the second wire is connected to the first electrode pad or the second electrode pad, and the one of the first wire and the second wire is connected to a bump and a first measurement circuit for measuring a connection,
the other of the first wire and the second wire is not connected to any of the first electrode pad and the second electrode pad and the other of the first wire and the second wire is connected to a circuit substrate and a second measurement circuit that measures another connection across the other of the first wire and the second wire, and
a break strength of each of the first wire and the second wire is lower than a break strength of the join-structure between the circuit substrate and the semiconductor package.

2. The substrate according to claim 1,
wherein the first measurement circuit is configured to measure a first electrical resistance value of the first wire, and output a first disconnection signal representing disconnection of the first wire, if the first electrical resistance value exceeds a predetermined threshold value; and
wherein the second measurement circuit is configured to measure a second electrical resistance value of the second wire, and output a second disconnection signal representing disconnection of the second wire, if the second electrical resistance value exceeds the predetermined threshold value,
wherein the first disconnection signal or the second disconnection signal is used in failure prediction.

3. The substrate according to claim 1, further comprising a prediction circuit configured to perform failure prediction by using the first disconnection signal and the second disconnection signal.

4. A substrate comprising:
a join-structure including a semiconductor chip, semiconductor package, first electrode pad, bump, second electrode pad, and circuit substrate joined in the order named; and
a first wire and a second wire formed in a region of the semiconductor package below a corner of the semiconductor chip, each of the first wire and the second wire having a low-strength structure,
wherein:
one of the first wire and the second wire is connected to the first electrode pad and/or the second electrode pad and the one of the first wire and the second wire is connected to a bump and to a first measurement circuit for measuring a connection,
the other of the first and the second wire is not connected to any of the first electrode pad and the second electrode pad and the other of the first and the second wire is connected to a circuit substrate and a second measurement circuit that measures another connection across the other of the first wire and the second wire, and
a break strength of each of the first wire and the second wire is lower than a break strength of the join-structure between the semiconductor package and the semiconductor chip.

5. A method of predicting a failure of a substrate, the substrate including a join-structure, first wire, first measurement circuit, second wire, and second measurement circuit, the join-structure including a semiconductor package, first electrode pad, bump, second electrode pad, and circuit substrate joined in the order named, the first wire being connected to the first electrode pad or the second electrode pad, and formed in a region below a corner of the semiconductor package, the first measurement circuit being connected to the first wire and configured to measure a first electrical resistance value of the first wire, the second wire not being connected to any of the first electrode pad and the second electrode pad and being formed in the region below the corner of the semiconductor package, the second measurement circuit being connected to the second wire and configured to measure a second electrical resistance value of the second wire, and wherein a break strength of each of the first wire and the second wire is lower than a break strength of the join-structure, the method comprising:
measuring the first electrical resistance value by the first measurement circuit; and
measuring the second electrical resistance value by the second measurement circuit, wherein the first electrical resistance value or the second electrical resistance value is used to predict a failure of the substrate.

6. The method according to claim 5, further comprising:
outputting, by the first measurement circuit, a first disconnection signal representing disconnection of the first wire, if the first electrical resistance value exceeds a predetermined threshold value; and
outputting, by the second measurement circuit, a second disconnection signal representing disconnection of the second wire, if the second electrical resistance value exceeds a predetermined threshold value,
wherein the first disconnection signal or the second disconnection signal is used to predict a failure of the substrate.

7. The method according to claim 6, wherein a time interval between the first disconnection signal and the second disconnection signal is used to predict a load applied to the join-structure of the substrate.

* * * * *